(12) United States Patent
Davis et al.

(10) Patent No.: US 7,023,219 B2
(45) Date of Patent: Apr. 4, 2006

(54) A/C GENERATOR ROTOR TEST APPARATUS

(75) Inventors: Randall D. Davis, Claremore, OK (US); Phillip E. Hudson, Skiatook, OK (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/880,694

(22) Filed: Jun. 29, 2004

(65) Prior Publication Data

US 2005/0285603 A1    Dec. 29, 2005

(51) Int. Cl.
*G01R 31/06* (2006.01)

(52) U.S. Cl. ............... 324/545; 324/772; 73/862.17

(58) Field of Classification Search ............. 73/862.17, 73/462; 324/772, 545
See application file for complete search history.

(56) References Cited

U.S. PATENT DOCUMENTS

| | | | |
|---|---|---|---|
| 3,595,073 A * | 7/1971 | Morris | ............... 73/862.17 |
| 3,798,515 A | 3/1974 | DiGiacomo | |
| 3,890,836 A | 6/1975 | McKenzie et al. | |
| 3,921,451 A | 11/1975 | DiGiacomo | |
| 4,070,624 A | 1/1978 | Taylor | |
| 4,419,894 A * | 12/1983 | Matumoto | ............... 73/462 |
| 4,651,086 A | 3/1987 | Domenichini et al. | |
| 4,658,213 A | 4/1987 | Finley | |
| 4,682,103 A | 7/1987 | DeNardis | |
| 4,687,990 A | 8/1987 | Finch | |
| 5,406,836 A | 4/1995 | Smith | |
| 5,550,485 A | 8/1996 | Falk | |
| 5,557,216 A | 9/1996 | Dailey et al. | |
| 5,568,058 A * | 10/1996 | Davis | ............... 324/772 |
| 5,684,718 A | 11/1997 | Jenkins et al. | |
| 5,928,022 A | 7/1999 | Moeller | |
| 6,392,419 B1 | 5/2002 | Divljakovic et al. | |

* cited by examiner

*Primary Examiner*—Vincent Q. Nguyen
(74) *Attorney, Agent, or Firm*—Ingrassia Fisher & Lorenz

(57) ABSTRACT

An assembly is provided for testing a circuit of a rotor of an AC generator. The assembly includes a base, a rack, a coil housing, one or more coils, and a rotor stand. The rack is coupled to the base and the coil housing is coupled to the rack. The one or more coils are disposed within the coil housing and are adapted to receive electrical power and configured, in response to receiving the power, to generate a magnetic field. The rotor stand is coupled to the base and configured to mount the rotor therein to position the rotor proximate the coil housing.

17 Claims, 5 Drawing Sheets

A/C GENERATOR ROTOR TEST APPARATUS

FIELD OF THE INVENTION

The present invention relates to generators, and more particularly, to testing generator rotors.

BACKGROUND OF THE INVENTION

Alternating current (AC) generators are used for myriad applications, for example, in a gas turbine engine, such as that found in aircraft, ships, and some terrestrial vehicles. These generators may include three separate brushless generators, namely, a permanent magnet generator (PMG), an exciter, and a main generator. Each of these generators may include rotors and stators. When the rotor rotates, AC currents are induced in stator windings of the generator.

Periodically, an AC generator rotor may need to undergo routine maintenance and testing to determine the electrical integrity of the wires and/or coils therein. Accordingly, the AC generator first may be separated from the engine. The rectifier and resistor lead terminals then may be disassembled and the bearings coupled to the generator may be removed. Multiple test instruments are connected to the appropriate sections of the disassembled AC generator to obtain the desired readings.

Although conventional methods of testing electrical integrity of AC generator rotors have been effective, these methods suffer from certain drawbacks. For example, disassembly of the AC generator rotor and subsequent performance of the multiple test parameters may be labor-intensive and time-consuming. Additionally, because each point-to-point connection and each test is performed manually, the likelihood of human error increases. Moreover, because each generator rotor may vary in size and configuration, each may need to be disassembled and tested individually.

Hence, there is a need for a device for testing an AC generator rotor and a method for using the device that do not require disassembly of the generator rotor, and/or is less labor-intensive and/or is less time-consuming to use, and/or is capable of being used for testing AC generator rotors of various sizes and configurations. The present invention addresses one or more of these needs.

SUMMARY OF THE INVENTION

The present invention provides an apparatus for testing generator rotors.

In one embodiment, and by way of example only, the assembly includes a base, a rack, a coil housing, one or more coils, and a rotor stand. The rack is coupled to the base and the coil housing is coupled to the rack. The one or more coils are disposed within the coil housing and are adapted to receive electrical power and configured, in response to receiving the power, to generate a magnetic field. The rotor stand is coupled to the base and configured to mount the rotor therein to position the rotor proximate the coil housing.

In another embodiment, the assembly further includes a rotor stand that has a platform, arms, and pins. First and second arms are coupled to the platform, while first and second pins are each mounted to the first and second arms, respectively, and configured to mate with the shaft first and second ends to mount the rotor therebetween.

Other independent features and advantages of the preferred device will become apparent from the following detailed description, taken in conjunction with the accompanying drawings which illustrate, by way of example, the principles of the invention.

DETAILED DESCRIPTION OF A PREFERRED EMBODIMENT

Before proceeding with the detailed description, it is to be appreciated that the present invention is not limited to use in conjunction with a specific type of electrical machine. Thus, although the present embodiment is, for convenience of explanation, depicted and described as being employed with a brushless AC (alternating current) generator, it will be appreciated that it can be employed with other AC generator designs.

Figure 1:
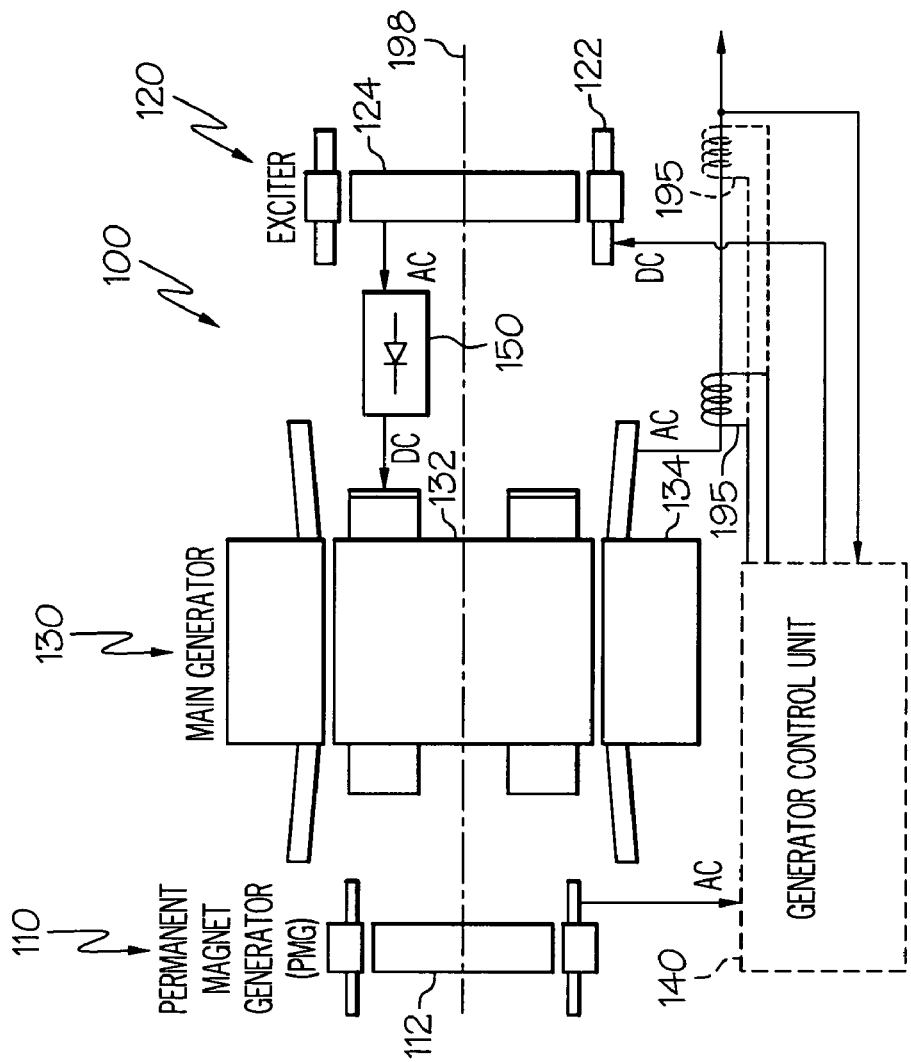
FIG. 1 is a functional schematic block diagram of an exemplary high speed generator system.

Turning now to the description, and with reference first to FIG. 1, a functional schematic block diagram of an exemplary high speed generator system 100 for use with a gas turbine engine such as that in an aircraft is depicted. This exemplary generator system 100, which is commonly known as a brushless AC generator, includes a permanent magnet generator (PMG) 110, an exciter 120, a main generator 130, a generator control unit 140, and one or more rectifier assemblies 150. During operation, a rotor 112 of the PMG 110, a rotor 124 of the exciter 120, and a rotor 132 of the main generator 130 may all rotate at the same speed. In one embodiment, the rotational speed may be, for example, in the range of about 12,000 to about 24,000 r.p.m., or greater. As the PMG rotor 112 rotates, the PMG 110 generates and supplies AC power to the generator control unit 140, which in turn is rectified and supplied as direct current (DC) power to a stator 122 of the exciter 120. The exciter rotor 124 in turn supplies AC power to the rectifier assemblies 150. The output from the rectifier assemblies 150 is DC power and is supplied to the main generator rotor 132. As the main generator rotor 132 rotates, magnetic flux lines are created about alternating north and south poles which induce an AC voltage into the main generator stator 134.

Figure 2:
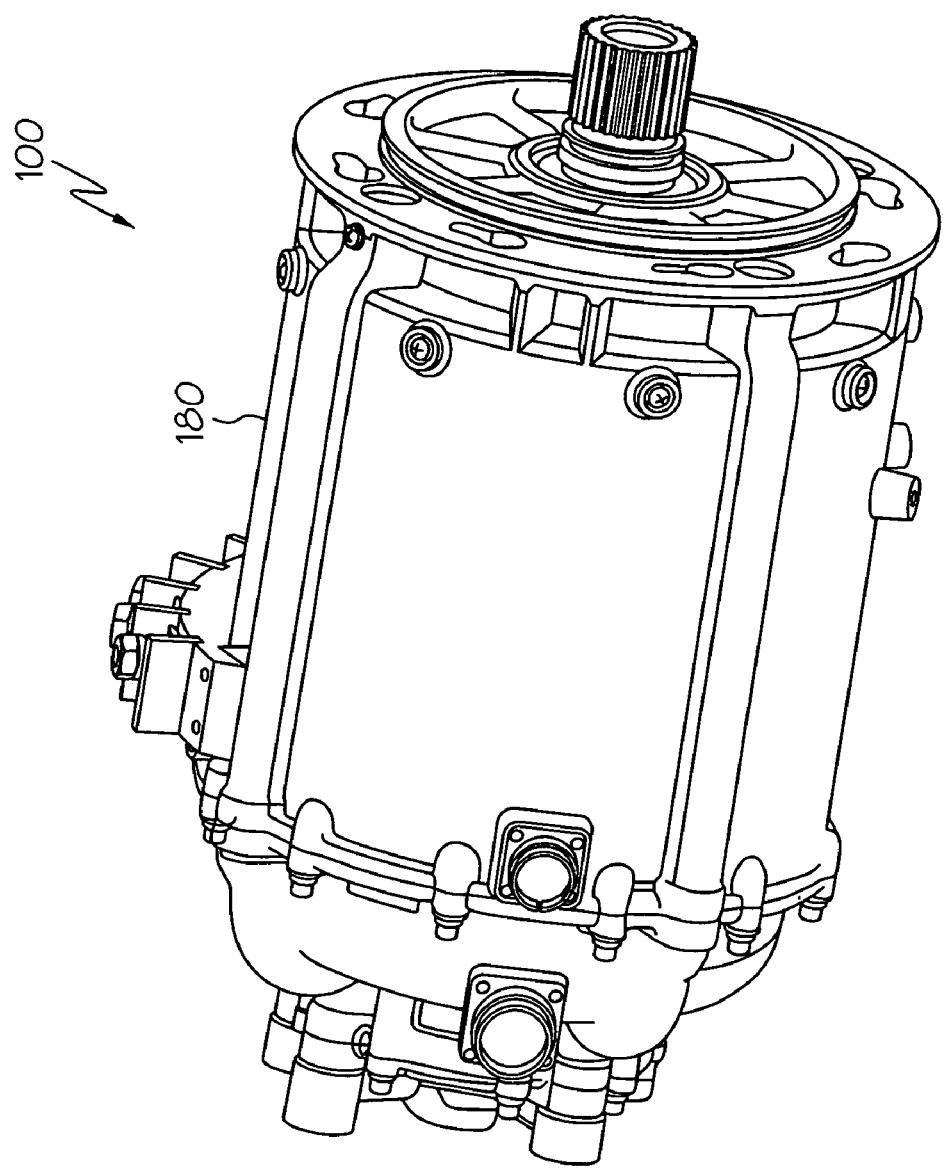
FIG. 2 is a perspective view of a physical embodiment of the generator system depicted in FIG. 1.

The generator system 100 is capable of providing output power at a variety of power levels and over a variety of frequency ranges. Further, typically the output power from the main generator stator 134 is three-phase AC power. The generator control unit 140 can regulate the power output based upon monitoring signals provided to it from monitoring devices 195. In the depicted embodiment, the PMG rotor 112, the exciter rotor 124, and the main generator rotor 132 all rotate along a single axis 198 at the same rotational speed. It will be appreciated, however, that in other embodiments the PMG rotor 112 may rotate along a different axis. Moreover, the relative positioning of the PMG 110, the exciter 120, and the main generator 130 can be modified in different embodiments such that the exciter 120 is physically between the PMG 110 and the main generator 130. A perspective view of a physical embodiment of at least those portions of the generator system 100 that are mounted within a generator housing 180 is provided in FIG. 2.

Figure 3:
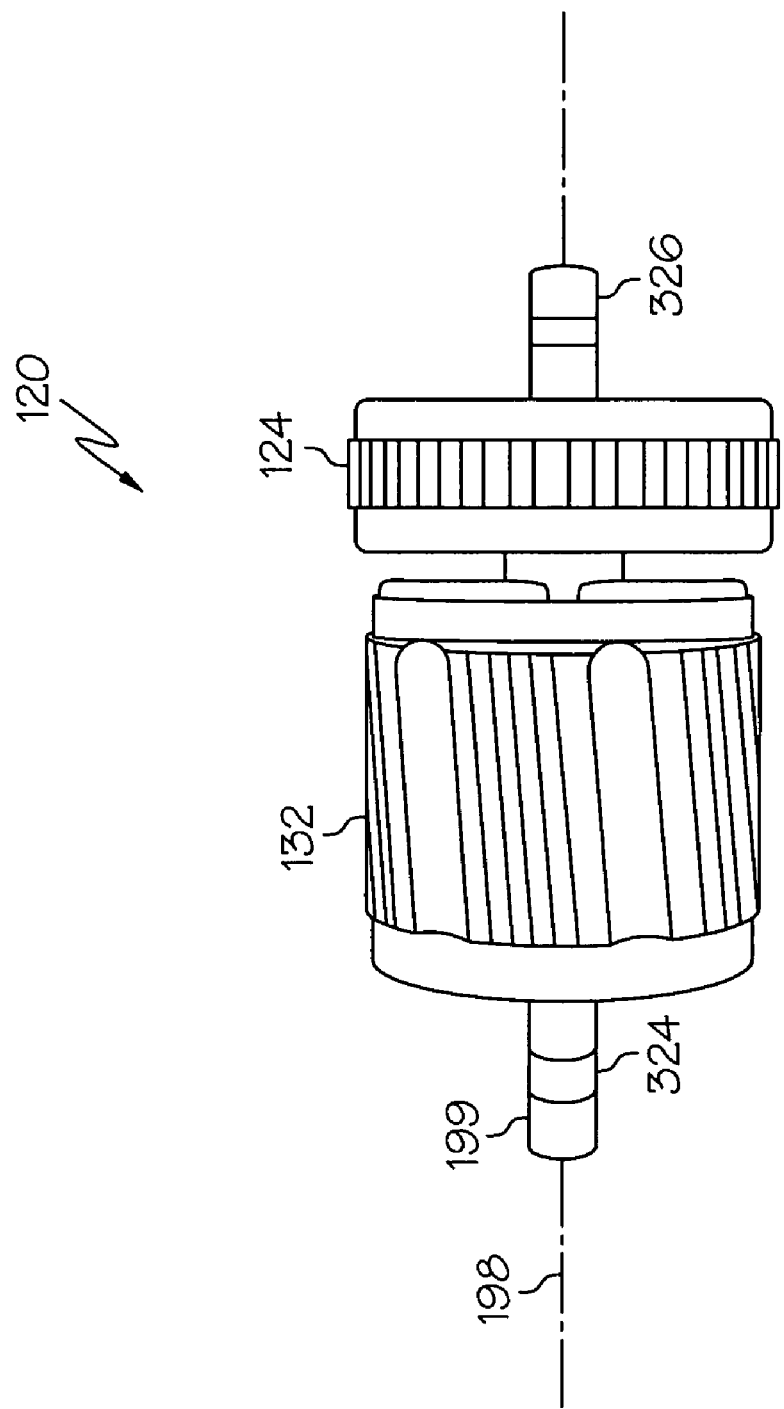
FIG. 3 is a perspective view of an exemplary physical embodiment of an exciter rotor and a main generator rotor that may be tested using the invention.

Turning now to FIG. 3, a perspective view of an exemplary physical embodiment of an exciter rotor 124 and main generator rotor 132 is illustrated. As shown, the exciter rotor 124 and main generator rotor 132 are each rotationally mounted on a common shaft assembly 199. The shaft assembly 199 extends axially through the exciter rotor 124 and main generator rotor 132 along the axis 198, and includes a first end 324 and a second end 326. The first end 324 is adapted to be coupled to a non-illustrated prime mover, which could be the aforementioned gas turbine engine, and thus may be referred to as the "drive end," while the second end 326 may be referred to as the "anti-drive end." The shaft assembly 199 is substantially hollow along most of its length, and includes openings (not illustrated) on each end 324, 326.

Figure 4:
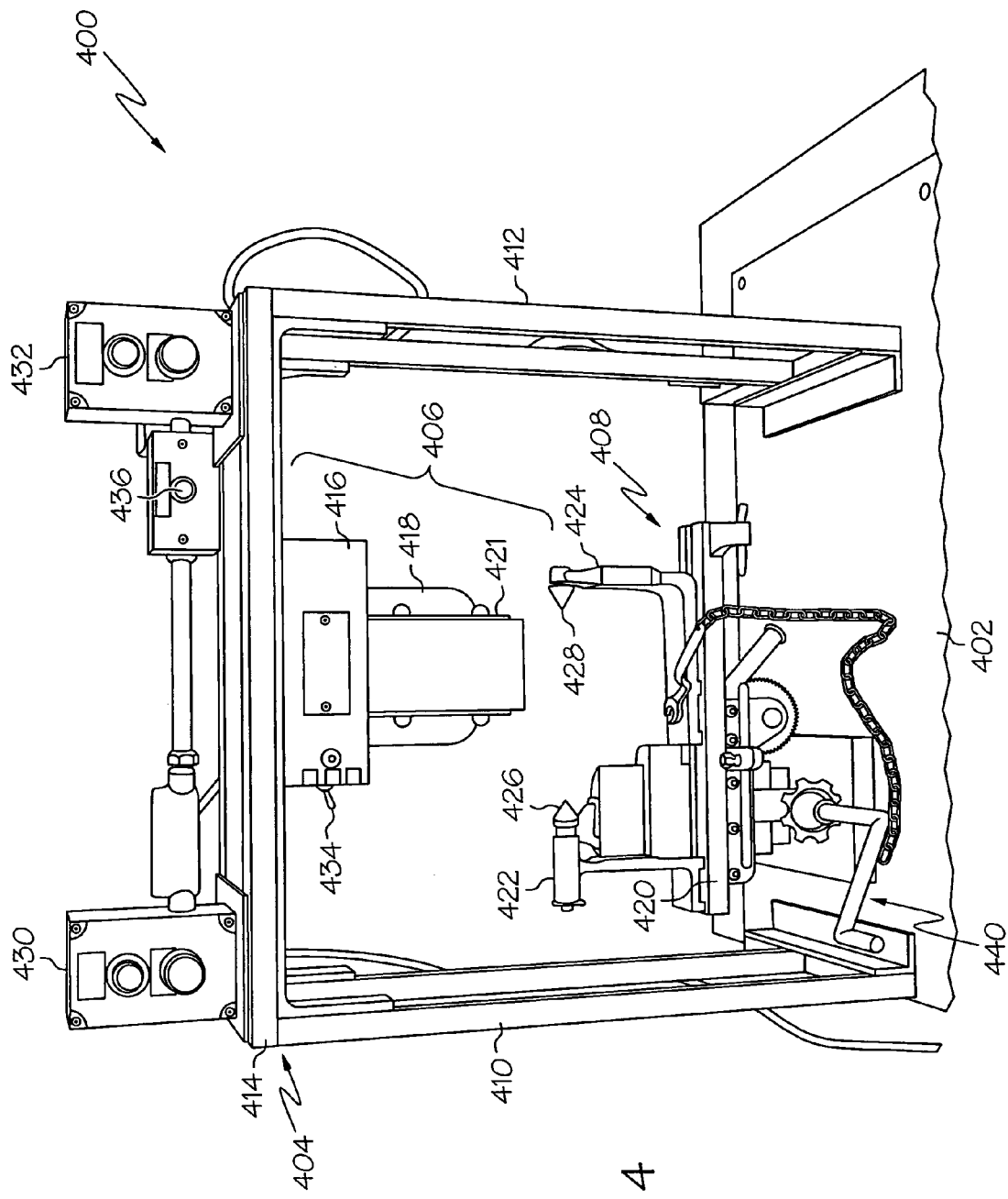
FIG. 4 is a perspective view of an exemplary physical embodiment of a test bench that may be used to testing the rotors depicted in FIG. 3.

To test the integrity of the windings (not shown) that are disposed within the exciter rotor 124 and/or main generator rotor 132, the rotors 124, 132 are mounted on a test bench 400, an exemplary physical embodiment of which is illustrated in FIG. 4. The test bench 400 includes a base 402, a rack 404 coupled to the base 402, a rotor rotor test device 406 mounted to the rack 404, and an adjustable stand 408.

The base 402 provides a foundation for the test bench 400. In the embodiment illustrated in FIG. 4, the base 402 is a sheet of sturdy material, such as, for example, steel or aluminum, that is capable of supporting the weight of various test equipment that may be mounted thereto. In another exemplary embodiment, the base 402 is mounted to a movable cart (not shown) so that the test bench 400 may be transported from location to location. In yet another exemplary embodiment, the base 402 is a conventional mounting surface, such as a table or movable cart.

The rack 404 includes a first and a second mounting arm 410, 412 and a shelf 414. In one exemplary embodiment, the first and second mounting arms 410, 412 are coupled to the base 402, and the shelf 414 is coupled between the arms 410, 412 such that a sufficient amount of space is provided to accommodate the rotors 124, 132. Although the shelf 414 is preferably installed on the ends of the arms 410, 412, it will be appreciated that the shelf 414 may be positioned on any section along the lengths of the arms 410, 412 and may additionally be configured to adjustably move along the length of the arms 410, 412. The rack 404 is preferably configured to provide a mounting surface to which various test equipment may be mounted. In this regard, the rack 404 is preferably constructed of material suitable for supporting the weight of the test equipment that may be mounted thereto, such as, for example, angle iron or utility channel square aluminum stock.

As previously noted, the rotor test device 406 is mounted to the rack 404. The rotor test device 406 may be any one of numerous types of equipment used for testing the integrity the AC generator rotors capable of generating an electromagnetic field within close proximity of the exciter rotor 124; however, in the depicted embodiment, the rotor test device 406 is a growler. The rotor test device 406 has a mount block 416, a coil housing 418 coupled to the mount block 416, and alternatively, may include a test result indicator box 432. The mount block 416 is coupled to the rack 404 and to the coil housing 418. The coil housing 418 houses coils that, when induced with a current, may be used to produce a magnetic field in the housing 418. The mount block 416 may further include a switch 434 for changing the polarity of the magnetic field. The coil housing 418 also includes a V-block 421 configured to deliver the magnetic field to a rotor that may be positioned proximate thereto.

The rotor test device 406 can be mounted to the rack 404 in any one of numerous configurations. In one embodiment, the rotor test device 406 is mounted such that the V-block 421 faces the base 402. In the exemplary embodiment depicted in FIG. 4, the rotor test device 406 is coupled directly to the bottom side of the rack shelf 414. The rotor test device 406 may be attached to the shelf 414 via any one of numerous conventional coupling means, such as, for example, bolting, welding, or alternatively, suspending the device 406 from the shelf 414. In another exemplary embodiment, the rotor test device 406 is mounted to one of the arms 410, 412 of the rack 404, and, similar to the previous exemplary embodiment, the rotor test device 406 is coupled such that the V-block 421 faces the base 402.

In an alternative exemplary embodiment, the test result indicator box 432 is mounted to the rack and houses circuitry configured to turn an indicator 436, such as a light, noise, or any other means of providing an indication to a user, on or off to signify the continuity of a generator circuit being tested. The test result indicator box 432 is preferably mounted to the top of the rack shelf 414, however, as is appreciated by those with skill in the art, the boxes 430, 432 may be coupled to any portion of the test bench 400.

The stand 408 is coupled to the base 402 and configured to secure generators to be tested having various sizes to the test bench 400. In one exemplary embodiment, the stand 408 includes a platform 420 and two generator mount arms 422, 424 that are horizontally movable. The two arms 422, 424 are equipped with pins 426, 428 that are configured to mate with the drive and anti-drive ends 324, 326 of the shaft assembly 199. The two arms 422, 424 are locked into position via non-illustrated locking mechanisms.

In the depicted embodiment, the stand 408 is vertically movable to raise or lower the mounted generator closer to or further from the coil housing 418 and thus, has an adjustment mechanism 440 coupled thereto. The adjustment mechanism 440 can be any one of numerous mechanisms capable of vertical adjustability, such as, for example, the depicted manually-operated hand crank, or an automatic height adjustment mechanism, such as a hydraulic or pneumatic mechanism.

Although the rotor test device 406 is described herein as being used to test an exciter rotor 124 and main generator rotor 132, the test bench 400 is also capable of receiving and testing other types of generator rotors, including, but not limited to, single-phase AC generator rotors, commutator-type DC generator rotors, and brushless DC generator rotors.

An exemplary method of testing an AC generator using the test bench 400 will now be discussed generally. First, the test rotor is mounted to the test bench 400. After the rotor is mounted, it is rotated and readings indicating the integrity of the rotor are taken.

Figure 5:
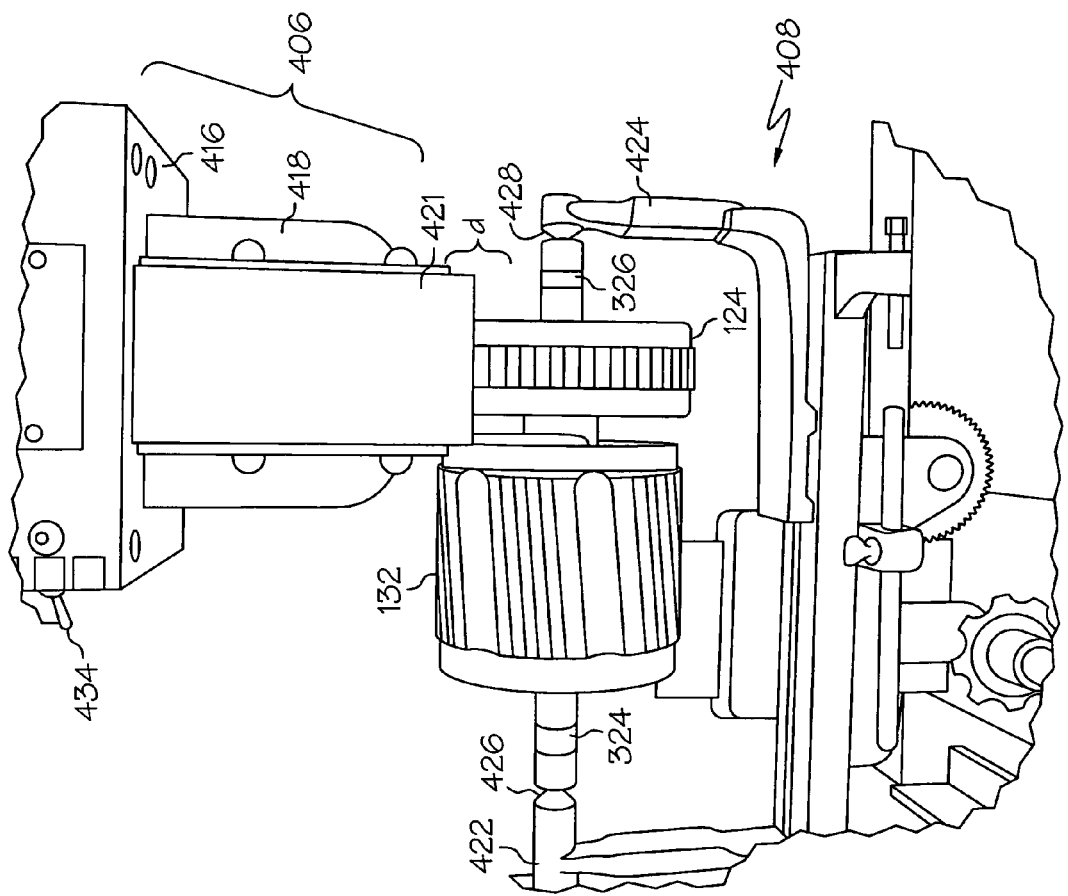
FIG. 5 is another perspective view of the exemplary physical embodiment of the test bench in FIG. 4 with an exciter rotor and a main generator rotor mounted thereon.

The particular steps by which a user mounts the rotor to the test bench 400 largely depends upon the particular configuration of the test bench 400 and the rotor itself. With reference now to FIG. 5, the exciter rotor 124 serves as the test rotor in which an AC voltage is induced. The stand 408 is lowered so as to provide sufficient space between the rotor test device 406 and the stand 408 to facilitate with placement of the exciter rotor 124 and main generator rotor 132 in the test bench 400. The drive end 324 and anti-drive end 326 of the shaft assembly 199 are aligned with the generator mount arms 422, 424 and mated with the arm pins 426, 428. The generator mount arms 422, 424 are moved horizontally toward one another to provide proper placement of the desired portion of the rotor 124 to be tested. In one exemplary embodiment of the method, the rotor 124 is positioned under the coil housing 418. After the arms 422, 424 are adjusted to provide a tight fit against the shaft assembly ends 324, 326, they are locked into place.

Next, the stand 408 is vertically adjusted to position the rotor 124 proximate the coil housing 418. Preferably, as shown in FIG. 5, the rotor 124 is placed a predetermined distance d from the coil housing 418 to allow the rotor 124 to rotate.

After the rotor 124 is properly mounted, a voltmeter (not shown), such as an analog voltmeter, is coupled thereto via leads (not shown). The leads that are connected to the volt meter are connected across the main field winding of the main generator rotor 132 which terminates within rotor 124. Power is supplied to the rotor test device 406 to create a magnetic field in a predetermined direction which may be changed via the switch 434.

The rotor 124 is then rotated at least once. When the rotor 124 rotates, an electromagnetic field is created by the rotor test device 406 and a voltage is induced in the three phase windings of the rotor 124. In one exemplary embodiment, a user manually rotates the rotor 124, however, as will be appreciated by those with skill in the art, the rotor 124 may be automatically rotated. In a preferred embodiment, the rotor 124 is rotated at rotational speed that will allow the operator to record and determine whether the measurements of the number of peaks and the amplitude of each peak fall within a predetermined range indicating operable rotors 124 and 132. For example, when testing a six-pole rotor, the voltmeter should indicate six individual deflections, each having a peak and a valley, for each rotor 124 rotation. Additionally, if the voltmeter is set at 0–1.0 Vdc range, each peak should be substantially equivalent to a 0.6–0.8 Vdc amplitude, and each valley should be more than 0 Vdc, but less than 0.1 Vdc.

In an alternate embodiment of the method, the test bench 200 is used to determine the integrity of a DC generator rotor. In this regard, first, the DC generator rotor is appropriately mounted to a test bench 200 at a predetermined distance away from the coil housing 418 so that the rotor does not contact the rotor test device 406. Then, the rotor 124 is rotated slowly through the stator 122 and conventional methods of checking for a shorted or open winding are employed. The indicator box 432 can be used to signify that one of the commutator windings does or does not have continuity and may or may not be defective.

Thus, there has been provided a device for testing an AC generator rotor and a method for using the device that do not require disassembly of the generator rotor, and/or is less labor-intensive or is less time-consuming to use, and/or is capable of being used for testing AC generator rotors of various sizes and configurations.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. An assembly for testing a circuit of a rotor of an AC generator, the assembly comprising:
    a base;
    a rack coupled to the base;
    a coil housing coupled to the rack;
    one or more coils disposed within the coil housing, the one or more coils adapted to receive electrical power and configured, in response thereto, to generate a magnetic field;
    a V-block coupled to the coil housing and configured to deliver the magnetic field to the rotor when the rotor is positioned proximate thereto; and
    a rotor stand coupled to the base, the stand configured to mount the rotor therein and to position the rotor proximate the coil housing.

2. The assembly of claim 1, wherein the stand is configured to be horizontally movable.

3. The assembly of claim 1, wherein the stand is configured to be vertically movable.

4. The assembly of claim 1, wherein the AC generator further comprises a shaft to which the rotor is rotationally mounted, the shaft having a first end and a second end, wherein the rotor stand further comprises:
    a platform;
    first and second arms coupled to the platform; and
    first and second pins mounted to the first and second arms, respectively, and configured to mate with the shaft fist and second ends to mount the rotor therebetween.

5. The assembly of claim 1, wherein the base is coupled to a movable cart.

6. The assembly of claim 1, wherein the base is coupled to a table.

7. The assembly of claim 1, wherein the rack further comprises an arm and a shelf coupled to the arm.

8. The assembly of claim 7, wherein the coil housing is coupled to the shelf.

9. The assembly of claim 7, wherein the coil housing is coupled to the arm.

10. An assembly for testing a circuit of a rotor of an AC generator, the assembly comprising
    a base;
    a rack coupled to the base; and
    a coil housing coupled to the rack;
    one or more coils disposed within the coil housing, the one or more coils adapted to receive electrical power and configured, in response thereto, to generate a magnetic field; and
    a rotor and coupled to the base, the stand configured to mount the rotor therein and to position the rotor proximate the coil housing and further comprising:
    a platform;
    first and second arms coupled to the platform; and
    first and second pins mounted to the first and second arms, respectively, and configured to mate with the shaft first and second ends to mount the rotor therebetween.

11. The assembly of claim 10, wherein the base is coupled to a movable cart.

12. The assembly of claim 10, where the base is coupled to a table.

13. The assembly of claim 10, wherein the stand is configured to be horizontally movable.

14. The assembly of claim 10, wherein the stand is configured to be vertically movable.

15. The assembly of claim 10, wherein the rack further comprises an arm and a shelf coupled to the arm.

16. The assembly of claim 15 wherein the coil housing is coupled to the shelf.

17. The assembly of claim 15, wherein the coil housing is coupled to the arm.

* * * * *

UNITED STATES PATENT AND TRADEMARK OFFICE
CERTIFICATE OF CORRECTION

| | |
|---|---|
| PATENT NO. | : 7,023,219 B2 |
| APPLICATION NO. | : 10/880694 |
| DATED | : April 4, 2006 |
| INVENTOR(S) | : Randall D. Davis et al. |

It is certified that error appears in the above-identified patent and that said Letters Patent is hereby corrected as shown below:

In claim 4, column 6, line 32, delete the word "fist" and insert the word --first--.
In claim 10, column 6, line 54, delete the word "and" and insert the word --stand--.
In claim 12, column 6, line 66, delete the word "where" and insert the word --wherein--.

Signed and Sealed this

Twenty-seventh Day of March, 2007

JON W. DUDAS
*Director of the United States Patent and Trademark Office*